(12) United States Patent
Hwan et al.

(10) Patent No.: US 6,825,509 B1
(45) Date of Patent: Nov. 30, 2004

(54) POWER DISTRIBUTION SYSTEM, METHOD, AND LAYOUT FOR AN ELECTRONIC DEVICE

(75) Inventors: Jin-Jer Hwan, Tempe, AZ (US); Haksu Kim, Chandler, AZ (US); Neel Das, Chandler, AZ (US); Malcolm A. White, Portland, OR (US)

(73) Assignee: Corrent Corporation, Tempe, AZ (US)

( * ) Notice: Subject to any disclaimer, the term of this patent is extended or adjusted under 35 U.S.C. 154(b) by 230 days.

(21) Appl. No.: 09/994,141

(22) Filed: Nov. 26, 2001

(51) Int. Cl.$^7$ ............................................... H01L 27/10
(52) U.S. Cl. ...................................... 257/207; 257/691
(58) Field of Search ................................. 257/207, 691

(56) References Cited

U.S. PATENT DOCUMENTS

| | | | |
|---|---|---|---|
| 5,119,168 A | * 6/1992 | Misawa | 257/691 |
| 5,831,315 A | 11/1998 | Kengeri et al. | 257/393 |
| 6,118,334 A | 9/2000 | Tanaka et al. | |
| 6,184,477 B1 | 2/2001 | Tanahashi | |
| 6,195,787 B1 | 2/2001 | Yokoyama | |
| 6,198,635 B1 | 3/2001 | Shenoy et al. | |
| 6,202,193 B1 | 3/2001 | Emura et al. | |
| 6,205,045 B1 | 3/2001 | Kuriyama et al. | |
| 6,247,162 B1 | 6/2001 | Fujine et al. | |
| 6,388,332 B1 | * 5/2002 | Aggarwal et al. | 257/774 |
| 6,657,307 B2 | 12/2003 | Iwamoto | 257/773 |

* cited by examiner

*Primary Examiner*—Luan Thai
(74) *Attorney, Agent, or Firm*—Gammage & Burnham, P.L.C.

(57) ABSTRACT

An electronic device such as an integrated circuit includes a power distribution system having a plurality of symmetrical power distribution structures, for example as triplet power line structures, distributed in parallel and spaced evenly across the surface of the electronic device. A plurality of circuit blocks are coupled to receive power through the power distribution structures. Each of the power distribution structures comprises a first power line for providing a first power supply voltage, and a second power line and a third power line for providing a second supply voltage. The second power line and the third power line are disposed symmetrically on opposite sides of the first power line.

32 Claims, 4 Drawing Sheets

POWER DISTRIBUTION SYSTEM, METHOD, AND LAYOUT FOR AN ELECTRONIC DEVICE

BACKGROUND OF THE INVENTION

The present invention relates in general to power distribution on an electronic device such as, for example, an integrated circuit or printed circuit board.

In designing the layout for a semiconductor integrated circuit, there is often a need to place identical circuit blocks next to each other. This is typically done by preparing the layout for a master circuit block (e.g., containing several thousands of transistor devices), placing the master circuit block layout within the overall chip layout for the integrated circuit, and then creating and placing identical (i.e., mirror or symmetrical) images of the master circuit block on the integrated circuit layout next to the master circuit block. Several such image circuit blocks may be formed depending on the particular integrated circuit design. One of the reasons that such image circuit blocks are formed is so that input/output pins to each circuit block can be placed on the layout so that they are opposite one another to reduce the layout area required and the layout routing distance necessary to connect the input/output pins to the rest of the integrated circuit.

In placing the master and image circuit blocks, care is generally taken to ensure that input/output signals and power supply connections common to the master and image circuit blocks are implemented in a way within the overall layout design so that routing congestion is minimized and signal timing and power supply parasitics are balanced and within acceptable variations for the master and image circuit blocks.

Prior layout approaches include the use of VDD and VSS power rings within each of the master and image circuit blocks. However, the use of such power rings consumes a large amount of layout area in part due to redundancy in the resulting power supply distribution grid across the integrated circuit. Prior overall chip layout design approaches further have not integrated the use of such power rings into a comprehensive and layout-efficient, top-down power distribution layout methodology. Instead, prior approaches typically defer full-chip power integration to the end of the layout process, which results in inefficient usage of layout area for power distribution needs.

In light of the foregoing, there is a need for an improved power distribution system for an integrated circuit layout that more efficiently uses the layout area required for providing power to master and image circuit blocks and other circuits in the integrated circuit. There is a further need for such a power distribution system that readily integrates with a top-down layout design and integration process for completing the overall circuit layout and power distribution design of the integrated circuit.

BRIEF DESCRIPTION OF THE DRAWINGS

For a more complete understanding of the present invention, reference is now made to the following figures, wherein like reference numbers refer to similar items throughout the figures.

DETAILED DESCRIPTION OF THE DRAWINGS

Figure 1:
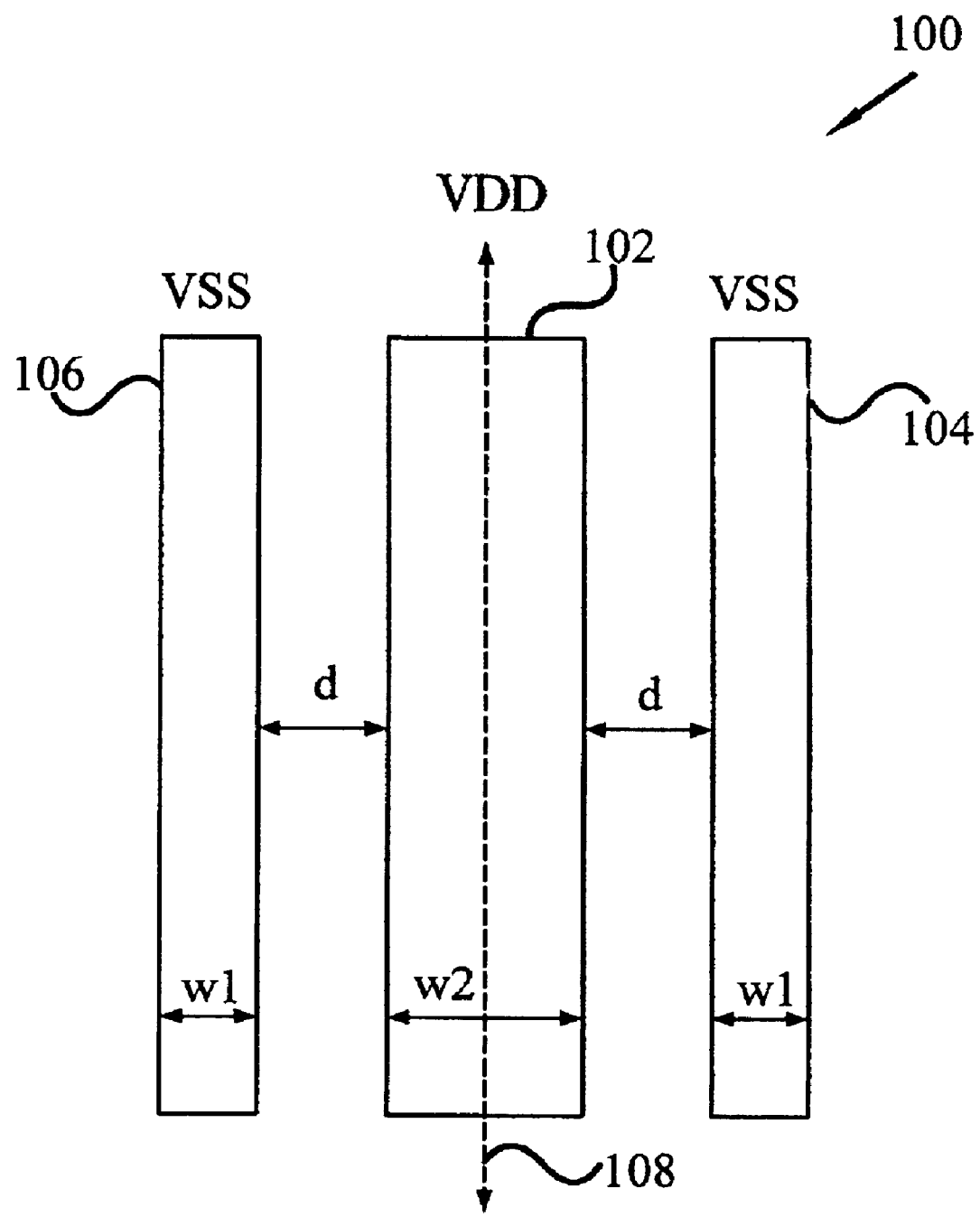
FIG. 1 is a layout view of a power distribution structure according to the present invention.

FIG. 1 is a layout view of a power distribution structure 100 according to the present invention. Structure 100 comprises a power line 102 for providing a first power supply voltage such as, for example, a positive supply voltage VDD, and power lines 104 and 106 for providing a second power supply voltage such as, for example, VSS or ground. The overall layout of structure 100 is symmetrical about a central symmetry axis 108 for ease in overall layout design and integration when structure 100 is incorporated into and coupled to circuit blocks as will be discussed further below. It should be noted that the relative ordering of VDD and VSS could be switched if desired so that power line 102 provides a voltage VSS and power lines 104 and 106 provide a voltage VDD.

Power line 102 has a line width w2 and power lines 104 and 106 have a line width w1. As will be discussed further below, structure 100 will extend over large portions of an integrated circuit layout running distances of, for example, 50 microns and greater. Because a single power line 102 is used to supply VDD and two power lines 104 and 106 of substantially identical shape are used to supply VSS, the width w2 is preferably about twice the width w1. However, this ratio could vary for specific designs. The separation distance d between power line 102 and power lines 104 and 106 is preferably substantially equal to maintain the symmetrical layout of structure 100.

It should be noted that structure 100 is illustrated as a triplet structure with three power lines. However, in other designs additional power lines could be used. It is preferable that such additional power lines also exhibit substantial symmetry about axis 108.

Figure 2:
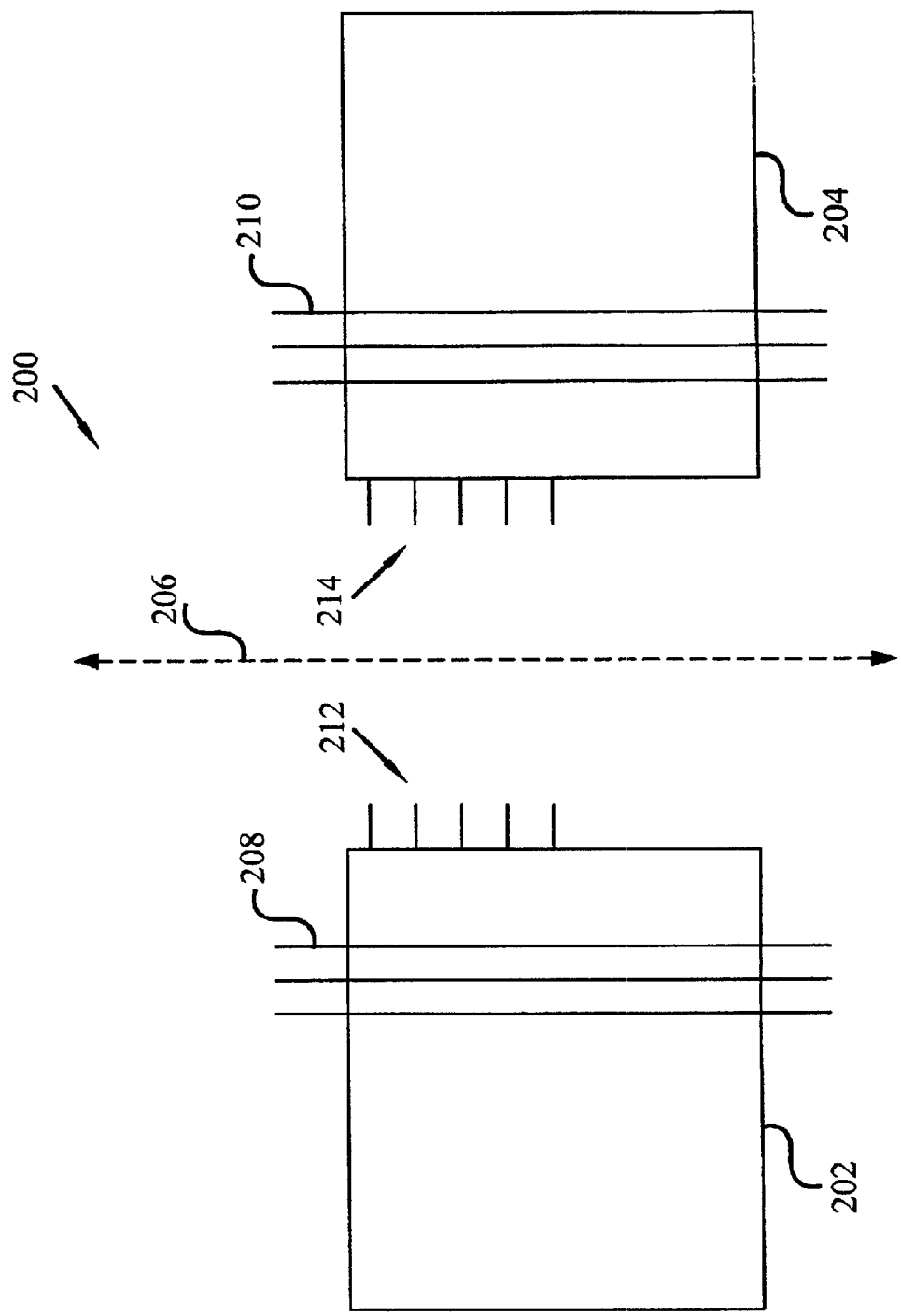
FIG. 2 is a layout view of master and image circuit blocks coupled to a power distribution structure according to the present invention.

FIG. 2 is a layout 200 of master and image circuit blocks coupled to a power distribution structure according to the present invention. Specifically, a master circuit block 202 and image circuit block 204 are disposed, for example, in the layout plan of an integrated circuit. However, it should be noted that the present invention is also applicable to the design of power distribution layouts for other electronic devices such as printed circuit board assemblies having many chips to be mounted on a printed circuit board. For printed circuit board assemblies (not shown), the circuit blocks to be mirrored would correspond to entire integrated circuit chips oriented to be symmetrical about a symmetry axis on the printed circuit board layout.

The term "block" as used herein generally refers to a related group of transistors and/or other electronic elements that, for example, implement specific logical or other functions for the integrated circuit or other electronic device. Master circuit block 202 is used as a master in creating an identical, but mirrored circuit layout for image circuit block 204. By mirroring the circuit layout, input/output pins 212 and 214 for each circuit block are disposed facing opposite one another in layout 200. The mirroring is done about symmetry axis 206. This basic process of forming a master and image circuit blocks may be repeated many times for different portions of an integrated circuit design.

Power distribution structures 208 and 210 run across layout 200 and are electrically coupled to and run across master and image circuit blocks 202 and 204. Although shown in simplified form for purposes of illustration, structures 208 and 210 may use, for example, structure 100 of FIG. 1 as the basic unit for layout across the full semiconductor chip. Blocks 202 and 204 may have sizes that vary, for example, from about 100 by 100 microns to 1,000 by 1,000 microns and larger. Also, the shape of blocks 202 and 204, although typically square or rectangular, may also vary for specific designs.

Figure 3:
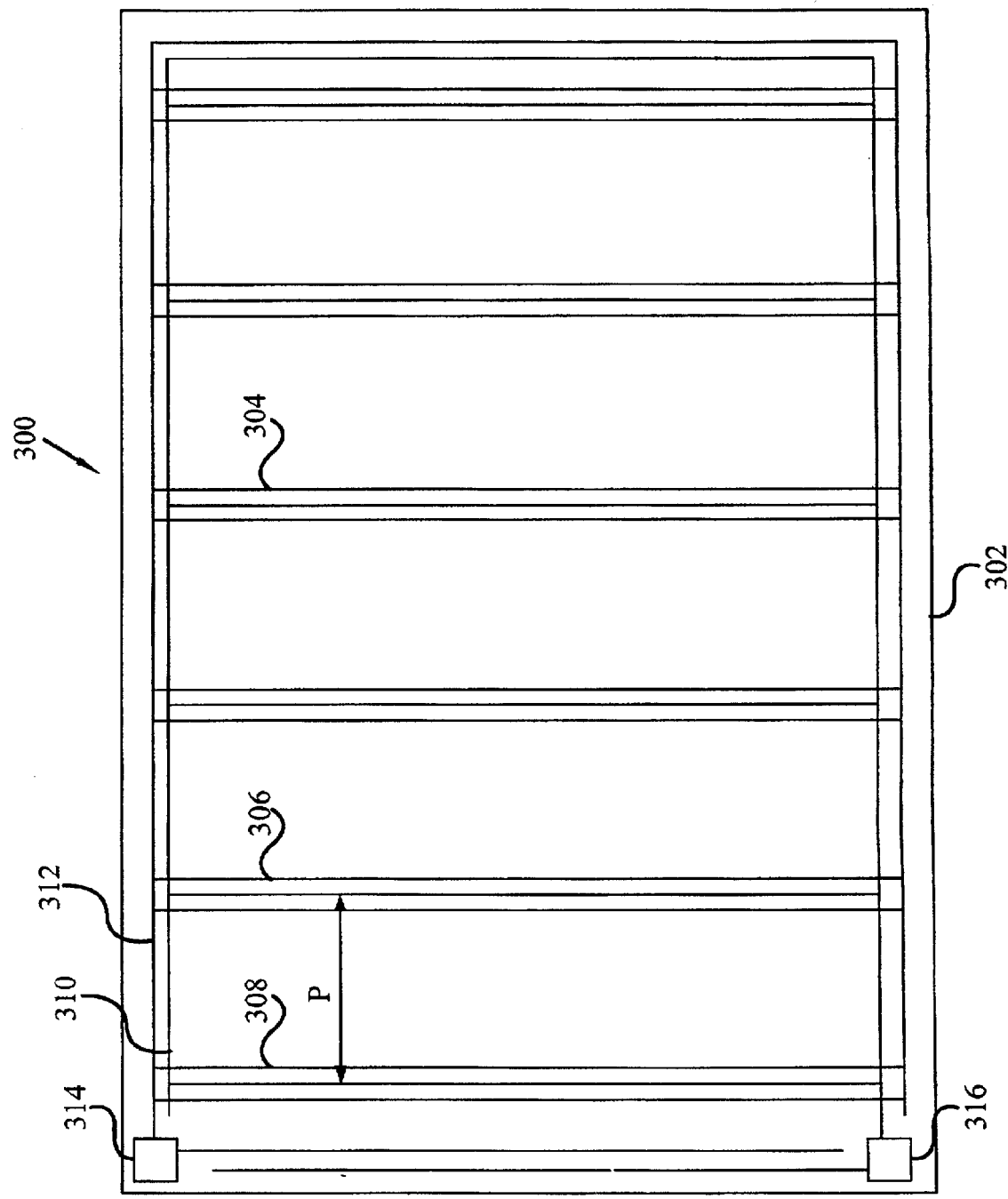
FIG. 3 is a layout plan for a full integrated circuit chip using a plurality of power distribution structures according to the present invention.

FIG. 3 is a layout plan 300 for a full integrated circuit chip 302 using a plurality of power distribution structures (e.g., structures 304, 306, and 308) spread across the surface of chip 302 to provide an overall power distribution system for providing supply voltages to circuits (illustrated in FIG. 4) on chip 302. These structures are formed, for example, in a top metal layer of the integrated circuit. According to the present invention, a common symmetrical power distribution structure such as structure 100 of FIG. 1 is repeated to form many such structures, spaced substantially evenly, to run across preferably the entire, or at least a substantial portion, of the layout for chip 302. The repeated structures, including, for example, structures 304, 306 and 308, are spaced with a pitch P, for example, of 100 microns. However, pitch P can vary widely and be optimized for specific layout and chip designs based on factors such as the predominant circuit block size to be incorporated into the integrated circuit.

Each of structures 304, 306, and 308 and the other similar repeated structures that may be disposed across chip 302 run substantially in parallel with each other and are, for example, connected to power distribution rings 310 and 312 running around the perimeter of chip 302. Each of distribution rings 310 and 312 is respectively connected to a power supply voltage pad 314 and 316 for coupling to external power supply sources that provide, for example, VDD and VSS potentials. It will be appreciated that many other forms of distribution rings and other structures may be used to electrically couple the repeating, symmetrical power distribution structures of the present invention to external power supply sources for chip 302. Rings 310 and 312 will generally have a line width that is greater than that of the power lines of structures 304, 306, and 308.

Figure 4:
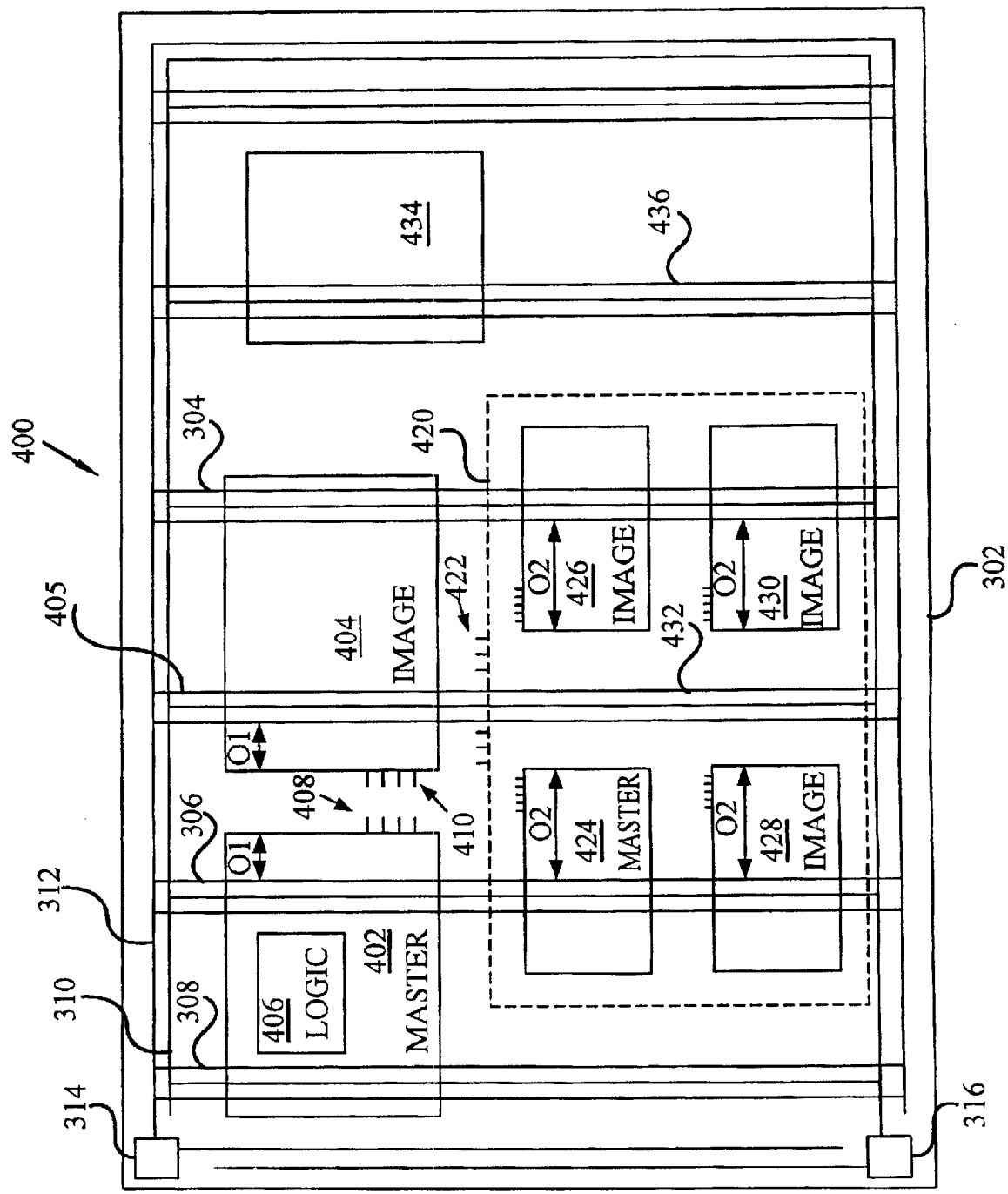
FIG. 4 is the layout plan of FIG. 3 showing the placement of master and image circuit blocks coupled to the power distribution structures.

FIG. 4 is a layout plan 400 including the layout plan 300 of FIG. 3 with the addition of master and image circuit blocks coupled to the repeated power distribution structures. Specifically, a master block 402 and image block 404 are placed in layout plan 400 and are electrically coupled to the repeated power structures 304, 306, 308 and 405. Pins 408 and 410 are used for input/output signals to each block. Master circuit block 402 contains, for example, a logic circuit 406 coupled to receive power through structure 308. This is typical and each circuit block may contain many such logic circuits.

It should be noted that according to the present invention master and image blocks 402 and 404 are placed within layout plan 400 so that an offset O1 from a boundary of the perimeter of each block to a corresponding power distribution structure is substantially equal. According to the present invention, this equal offset in combination with an even pitch P results in the relative position of the power distribution system to the circuitry (not shown) within each block being substantially the same for either the master or image blocks.

Other circuit blocks such as block 434 may also be placed in layout plan 400, even though there is no corresponding image block, and coupled to the power distribution structure 436. Also, a higher-level or super-block 420, having input/output signal pins 422, may contain a master block 424 and several image blocks 426, 428, and 430 all placed with a substantially equal offset O2 from corresponding power distribution structures. It should be noted that smaller blocks, for example master and image blocks 424 and 426 and also image blocks 428 and 430, may have a power distribution structure 432 disposed between them that is not electrically connected to either master block 424 or its image blocks.

According to a method of the present invention, a power distribution system is built in a top-down manner in which symmetrical power distribution structures are placed and spread evenly across chip 302 with a constant pitch P prior to the placement of individual master and image circuit blocks. The pitch P may be varied for differing circuit block sizes. For example, the pitch P may be made smaller if the predominant circuit block size is smaller. The structures 100 are substantially linear, each running substantially in parallel for distances of, for example, 50 microns or greater.

Next, after preparing the foregoing overall power distribution system layout, the master and image circuit blocks are added to and placed within the layout using a substantially constant offset from the block boundary to respective power distribution structures as described above. It should be noted that according to the present invention, power rings and other general power distribution schemes are typically not added to the master and image circuit blocks prior to integration into the overall chip layout. Instead, generally after placing the master and image circuit blocks within the overall layout power integration, electrical coupling of circuitry within each circuit block is provided.

According to the layout method above, the power distribution structures themselves are preferably not flipped or mirrored when forming image blocks because in general there is not a need to do this. Instead, the power distribution grid is first defined globally for chip 302 and then the master and image blocks formed and coupled to it. It should be noted that according to the present invention, the symmetrical layout of power distribution structure 100 aids in this layout design method. For example, when electrical connections are made in layout between circuitry and distribution structures 100 within a master block, the mirror image of the master block with its individual circuitry power connections will correspondingly match up to the other parallel distribution structure or structures used to power the image circuit block. Because of the symmetry of structures 100, the final layout of the circuit block and the corresponding structures 100 connected to it will be a mirror image just as if all circuitry and power lines running across a master block were actually flipped or mirrored.

By the foregoing description, a novel method and system for a power distribution system for an electronic device have been described. The present invention has the advantages of more efficiently using the layout area required for providing power to master and image circuit blocks and other circuits in an integrated circuit. Also, the present invention provides a top-down layout design and integration process for completing the overall circuit layout and power distribution design of the integrated circuit to use chip area in a more efficient manner.

Although specific embodiments have been described above, it will be appreciated that numerous modifications and substitutions of the invention may be made. Accordingly, the invention has been described by way of illustration rather than limitation.

What is claimed is:

1. An integrated circuit including a power distribution system, the integrated circuit comprising:
a plurality of symmetrical power distribution structures associated with the power distribution system and distributed across at least a portion of a surface of the integrated circuit;
a plurality of circuit blocks coupled for receiving power through one or more of the plurality of power distribution structures; and
wherein:
(a) each of the plurality of power distribution structures comprises:
(a1) a first power line for providing a first power supply voltage; and
(a2) a second power line and a third power line for providing a second supply voltage, wherein the second power line and the third power line are disposed symmetrically on opposite sides of the first power line;
(b) the first power line and second power line are substantially parallel;
(c) the second power line and the third power line each substantially has a width w and the first power line has a width equal to about twice the width w; and
(d) the plurality of power distribution structures are spaced substantially evenly across the portion of the surface.

2. The integrated circuit of claim 1 wherein a first separation distance between the first power line and the second power line is about equal to a second separation distance between the first power line and the third power line.

3. The integrated circuit of claim 1 wherein:
(a) the plurality of circuit blocks comprises:
(a1) a first circuit block; and
(a2) a second circuit block that is substantially disposed as a mirror image of the first circuit block; and
(b) a boundary of the first circuit block and a corresponding mirrored boundary of the second circuit block are offset a substantially equal distance from the plurality of power distribution structures.

4. The integrated circuit of claim 3 wherein the first circuit block comprises a logic circuit.

5. An electronic device including a power distribution system, the electronic device comprising:
a plurality of substantially symmetrical power distribution structures associated with the power distribution system and distributed across at least a portion of a surface of the electronic device, wherein each of the plurality of power distribution structures comprises a first power line, a second power line, and a third power line;
a plurality of circuit blocks coupled for receiving power through one or more of the plurality of power distribution structures; and
wherein:
the first power line provides a first power supply voltage;
the second power line and the third power line provide a second supply voltage;
the second power line and the third power line are disposed substantially symmetrically on opposite sides of the first power line; and
the first power line has a width greater than the width of each of the second power line and the third power line.

6. The electronic device of claim 5 wherein each of the plurality of power distribution structures is a triplet structure and the plurality of power distribution structures is spaced with a substantially constant pitch.

7. The electronic device of claim 5 wherein the first power line and second power line are substantially parallel.

8. The electronic device of claim 7 wherein the plurality of power distribution structures are spaced substantially evenly across the portion of the surface.

9. The electronic device of claim 5 wherein:
the second power line and the third power line each substantially has a width w; and
the first power line has a width equal to about twice the width w.

10. The electronic device of claim 9 wherein a first separation distance between the first power line and the second power line is about equal to a second separation distance between the first power line and the third power line.

11. The electronic device of claim 5 wherein:
the first power supply voltage is a ground voltage; and
the second power supply voltage is a positive voltage relative to the ground voltage.

12. The electronic device of claim 11 further comprising:
a first power supply voltage pad disposed substantially at the surface of the electronic device and electrically coupled to at least one of the plurality of power distribution structures; and
a second power supply voltage pad disposed substantially at the surface of the electronic device and electrically coupled to at least one of the plurality of power distribution structures.

13. The electronic device of claim 12 wherein the electronic device is an integrated circuit chip and further comprising a power distribution ring, disposed around a substantial portion of the perimeter of the integrated circuit chip, electrically coupled to the first power supply voltage pad and to the plurality of power distribution structures.

14. The electronic device of claim 12 wherein the first power supply voltage pad corresponds to the ground voltage and the second power supply voltage pad corresponds to the positive voltage.

15. The electronic device of claim 5 wherein the electronic device is selected from the group consisting of:
an integrated circuit; and
a printed circuit board assembly.

16. The electronic device of claim 5 wherein the plurality of circuit blocks is selected from the group consisting of:
a plurality of semiconductor chips mounted on a printed circuit board, wherein each of the semiconductor chips comprises a transistor; and
a plurality of transistor circuits disposed in an integrated circuit.

17. The electronic device of claim 5 wherein the plurality of circuit blocks comprises:
a first circuit block; and
a second circuit block that is substantially a mirror image of the first circuit block.

18. The electronic device of claim 17 wherein a boundary of the first circuit block and a corresponding mirrored boundary of the second circuit block are offset a substantially equal distance from the plurality of power distribution structures.

19. The electronic device of claim 18 wherein the first circuit block comprises a logic circuit.

20. A power distribution structure for providing power supply voltages to a plurality of circuit blocks in an integrated circuit, the power distribution structure comprising:

a first power line having a width w to provide a first power supply voltage to the plurality of circuit blocks;

a second power line, having a width to about one-half of width w and running substantially parallel to the first power line, to provide a second power supply voltage to at least a portion of the plurality of circuit blocks;

a third power line having a width substantially equal to about one-half of width w and running substantially parallel to the first power line and to the second power line, to provide the second power supply voltage to at least a portion of the plurality of circuit blocks; and wherein the first power line, the second power line, and the third power line are symmetrically disposed about a center axis running substantially parallel to and inside the layout boundary of the first power line.

21. The power distribution structure of claim 20 wherein the first power line and the second power line run substantially parallel for a distance of more than about 50 microns.

22. The power distribution structure of claim 21 wherein a first separation distance between the first power line and the second power line is about equal to a second separation distance between the first power line and the third power line.

23. The power distribution structure of claim 20 wherein:
the first power line is electrically coupled to a first circuit block of the plurality of circuit blocks; and
the second power line is electrically coupled to the first circuit block.

24. The power distribution structure of claim 23 wherein a substantially linear side of the perimeter of the first circuit block runs substantially parallel to the first power line for a distance of more than about 50 microns.

25. An integrated circuit comprising:
a master circuit block layout;
an image circuit block layout;
a power distribution system comprising a first power distribution structure running substantially across the master circuit block layout and a second power distribution structure running substantially across the image circuit block layout; and
wherein:
(i) the first and second power distribution structures are each substantially symmetrical about a central axis, substantially the same in shape, and each coupled to the power distribution system to provide first and second power supply voltages to the master and image circuit block layouts;
(ii) the image circuit block layout has a substantially identical layout to the master circuit block layout; and
(iii) the layout positions of the first and second power distribution structures relative to the corresponding master and image circuit block layouts is substantially symmetrical about a symmetry axis located between the master and image circuit block layouts.

26. The integrated circuit of claim 25 wherein the first and second power distribution structures each comprises:
a first power line having a width w to provide the first power supply voltage to the master and image circuit block layouts;

a second power line, having a width equal to about one-half of width w and running substantially parallel to the first power line, to provide the second power supply voltage to the master and image circuit block layouts;

a third power line having a width substantially equal to about one-half of width w and running substantially parallel to the first power line and to the second power line, to provide the second power supply voltage; and wherein the first power line, the second power line, and the third power line are symmetrically disposed about the central axis.

27. The integrated circuit of claim 25 wherein the first and second power distribution structures each comprises a first power line, a second power line, and a third power line and each of the first, second and third power lines is symmetrically disposed about the central axis.

28. The integrated circuit of claim 25 wherein the first and second power distribution structures each comprises:
a first power line having a width w to provide the first power supply voltage to the master and image circuit block layouts; and
a second power line, having a width less than width w and running substantially parallel to the first power line, to provide the second power supply voltage to the master and image circuit block layouts.

29. The integrated circuit of claim 28 wherein the first and second power distribution structures each further comprises:
a third power line having a width less than width w and running substantially parallel to the first power line and to the second power line, to provide the second power supply voltage; and
wherein the first power line, the second power line, and the third power line are symmetrically disposed about the central axis.

30. An electronic device including a power distribution system, the electronic device comprising:
a plurality of substantially symmetrical power distribution structures associated with the power distribution system and distributed across at least a portion of a surface of the electronic device, wherein each of the plurality of power distribution structures comprises a first power line, a second power line, and a third power line;
a plurality of circuit blocks coupled for receiving power through one or more of the plurality of power distribution structures; and
wherein the plurality of circuit blocks comprises:
a first circuit block; and
a second circuit block that is substantially a mirror image of the first circuit block.

31. The electronic device of claim 30 wherein a boundary of the first circuit block and a corresponding mirrored boundary of the second circuit block are offset a substantially equal distance from the plurality of power distribution structures.

32. The electronic device of claim 31 wherein the first circuit block comprises a logic circuit.

* * * * *